(12) United States Patent  
Gill

(10) Patent No.: US 7,130,167 B2
(45) Date of Patent: Oct. 31, 2006

(54) MAGNETORESISTIVE SENSOR HAVING IMPROVED SYNTHETIC FREE LAYER

(75) Inventor: Hardayal Singh Gill, Palo Alto, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 414 days.

(21) Appl. No.: 10/793,571

(22) Filed: Mar. 3, 2004

(65) Prior Publication Data

US 2005/0195534 A1    Sep. 8, 2005

(51) Int. Cl.
 *G11B 5/39*   (2006.01)
(52) U.S. Cl. ................... 360/324.12; 360/324.2
(58) Field of Classification Search .......... 360/324.1, 360/324.11, 324.12, 324.2
See application file for complete search history.

(56) References Cited

U.S. PATENT DOCUMENTS

| 5,796,561 | A | 8/1998 | Mauri | 360/113 |
| 5,955,211 | A * | 9/1999 | Maeda et al. | 428/811.2 |
| 6,195,240 | B1 | 2/2001 | Gill | 360/324.12 |
| 6,275,362 | B1 | 8/2001 | Pinarbasi | 360/324.12 |
| 6,353,519 | B1 | 3/2002 | Pinarbasi | 360/324.11 |
| 6,356,419 | B1 | 3/2002 | Gill | 360/324.11 |
| 6,430,014 | B1 | 8/2002 | Gill | 360/324.12 |
| 6,473,279 | B1 * | 10/2002 | Smith et al. | 360/324.12 |
| 6,549,383 | B1 | 4/2003 | Gill | 360/324.11 |
| 6,665,155 | B1 | 12/2003 | Gill | 360/324.12 |
| 6,731,479 | B1 * | 5/2004 | Ooshima et al. | 360/324.12 |
| 6,757,962 | B1 * | 7/2004 | Hasegawa et al. | 29/603.14 |
| 2001/0040780 | A1 | 11/2001 | Pinarbasi | 360/324.11 |
| 2004/0001372 | A1 * | 1/2004 | Higo et al. | 365/200 |

* cited by examiner

*Primary Examiner*—Jefferson Evans
(74) *Attorney, Agent, or Firm*—Zilka-Kotab, PC

(57) ABSTRACT

A magnetoresistive sensor having employing a synthetic free layer having a first magnetic layer that contributes strongly to the GMR effect and a second magnetic layer that does not contribute to GMR effect, but has a negative magnetostriction to compensate for a positive magnetostriction of the first ferromagnetic layer.

20 Claims, 4 Drawing Sheets

MAGNETORESISTIVE SENSOR HAVING IMPROVED SYNTHETIC FREE LAYER

FIELD OF THE INVENTION

The present invention relates to magnetoresitive sensors and more particularly to a giant magnetoresistive sensor, GMR having an improved synthetic free layer.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of a rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

A spin valve sensor is characterized by a magnetiresistive (MR) coefficient that is substantially higher than the MR coefficient of an anisotropic magnetoresistive (AMR) sensor. For this reason a spin valve sensor is sometimes referred to as a giant magnetoresistive (GMR) sensor. When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer). A pinning layer in a bottom spin valve is typically made of platinum manganese (PtMn). The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Sensors can also be categorized as current in plane (CIP) sensors or as current perpendicular to plane (CPP) sensors. In a CIP sensor, current flows from one side of the sensor to the other side in the parallel to the planes of the materials making up the sensor. Conversely, in a CPP sensor the sense current flows from the top of the sensor to the bottom of the sensor perpendicular to the plane of the layers of material making up the sensor.

Yet another type of sensor, somewhat similar to a CPP GMR sensor is a Tunnel Valve. A tunnel valve employs an electrically insulating spacer layer rather than a conductive spacer layer. A tunnel valve operates based on quantum mechanical tunneling of electrons through the insulating spacer layer. This tunneling is maximized when the magnetizations of the free and pinned layers are parallel to one another adjacent to the spacer layer.

Recently, researchers have found that a change in the material of the pinned layer adjacent to the spacer layer can increase δr of the sensor. For example it has been found if the magnetic layers of the pinned layer are comprised of substantially equal parts Co and Fe, ie. $Co_{50}Fe_{50}$, the δr of a CPP spin valve can be improved significantly. In a CIP spin valve similar δr improvement has been found with the use of $Co_{90}Fe_{10}$ in the pinned layer. These materials have strong positive magnetostriction, which means that the compressive stresses which inevitably occur in a spin valve will tend to magnetize the pinned layers perpendicular to the ABS of the sensor. This is not a problem for the pinned layer, and is even an advantage, since this is the desired direction of pinning, and the magnetostriction only acts to assist the desired pinning.

It would be possible to achieve a similar δr improvement by using similar material in the free layer (ie. $Co_{50}Fe_{50}$ for CPP, $Co_{90}Fe_{10}$ for CIP). However, the strong positive magnetostriction of these materials would magnetize the free layer in an undesirable direction perpendicular to the ABS. This would lead to unacceptable signal noise and free layer instability.

Another mechanism for increasing GMR effect, or δr, is to increase the thickness of the free and pinned layers. This is especially suitable in a CPP sensor where the total thickness of the sensor is not as limiting. It is known that increasing the thickness of the free layer can increase the GMR effect. However, increasing the free layer thickness also increases the magnetic thickness. This leads to free layer stiffness, because the coercivity of the free layer increases to the point that the sensor becomes insensitive to signals. One method that has been proposed to overcome this has been to form an antiparallel coupled free layer also referred to as a synthetic free layer. Such a synthetic free layer is similar to an AP pinned layer in that it has first and second magnetic layers having magnetizations that are antiparallel to one another across a coupling layer such as Ru. The synthetic free layer has a larger physical thickness than a simple free layer, but has a much smaller magnetic thickness, which is the difference between the magnetic thicknesses of the first and second magnetic layers.

A serious disadvantage of such a synthetic free layer is that the second magnetic layer (that which is furthest from the spacer layer) subtracts from the GMR effect, because it is 180 degrees out of phase with the magnetization of the first magnetic layer adjacent to the spacer. Therefore, any GMR advantage achieved by the use of synthetic free layers is essentially lost by this subtractive effect of the second layer.

Therefore, there remains a strong felt need for a mechanism for taking advantage of the increased GMR effects provided by the use of materials such as $Co_{50}Fe_{50}$ or $Co_{90}Fe_{10}$ in a free layer while mitigating the problems associated with the strong positive magnetostriction of such materials. There also remains a strong felt need for a means for utilizing the advantages of synthetic free layers in a spin valve without experiencing the subtractive effect of the second free layer on the GMR on the sensor.

SUMMARY OF THE INVENTION

The present invention provides a sensor having a synthetic free layer having first and second magnetic materials separated by a non-magnetic coupling layer. The first magnetic layer of the free layer contributes strongly to a GMR effect and has a positive magnetostriction, whereas the second ferromagnetic layer contributes very little to GMR effect and has a negative magnetostriction that compensates for the positive magnetostriction of the first magnetic layer of the free layer.

The present invention allows the sensor to utilize the benefits of a synthetic free layer, that is large physical thickness with small magnetic thickness, while mitigating the subtractive GMR typical caused by second magnetic layer of a synthetic free layer.

The present invention also advantageously allows the use of materials such as $Co_{50}Fe_{50}$ in the free layer, which provide excellent GMR effect, but suffer from strong positive magnetostriction. The strong positive mangetostriction of the such materials used in a first magnetic layer is compensated by a negative magnetostriction in the second magnetic layer of the sensor.

The present invention may include a synthetic free layer having a first layer comprising substantially equal parts of Co and Fe. The synthetic free layer might also include a second layer constructed of CoNiX, where X is selected from the group consisting of: Nb, Mo, W, Si and B.

The present invention might also include a synthetic free layer having a first layer comprising $Co_{90}Fe_{10}$ or some similar material and a second layer constructed of CoNiX, where X is selected from the group consisting of: Nb, Mo, W, Si and B.

The present invention could be embodied in a current perpendicular to plane CPP GMR sensor, a current in plane (CIP) GMR sensor, a tunnel valve or some other sort of sensor such as a differential GMR or dual spin valve sensor.

The present invention could include a self pinned pinned layer or a pinned layer that is pinned by exchange coupling with an AFM layer. The pinned layer may be an antiparallel coupled pinned layer including first and second magnetic layers formed of $Co_{50}Fe_{50}$, or some similar material. The pinned layer could also include a first and second magnetic layers comprising $Co_{50}Fe_{50}$, and $Co_{90}Fe_{10}$ respectively.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
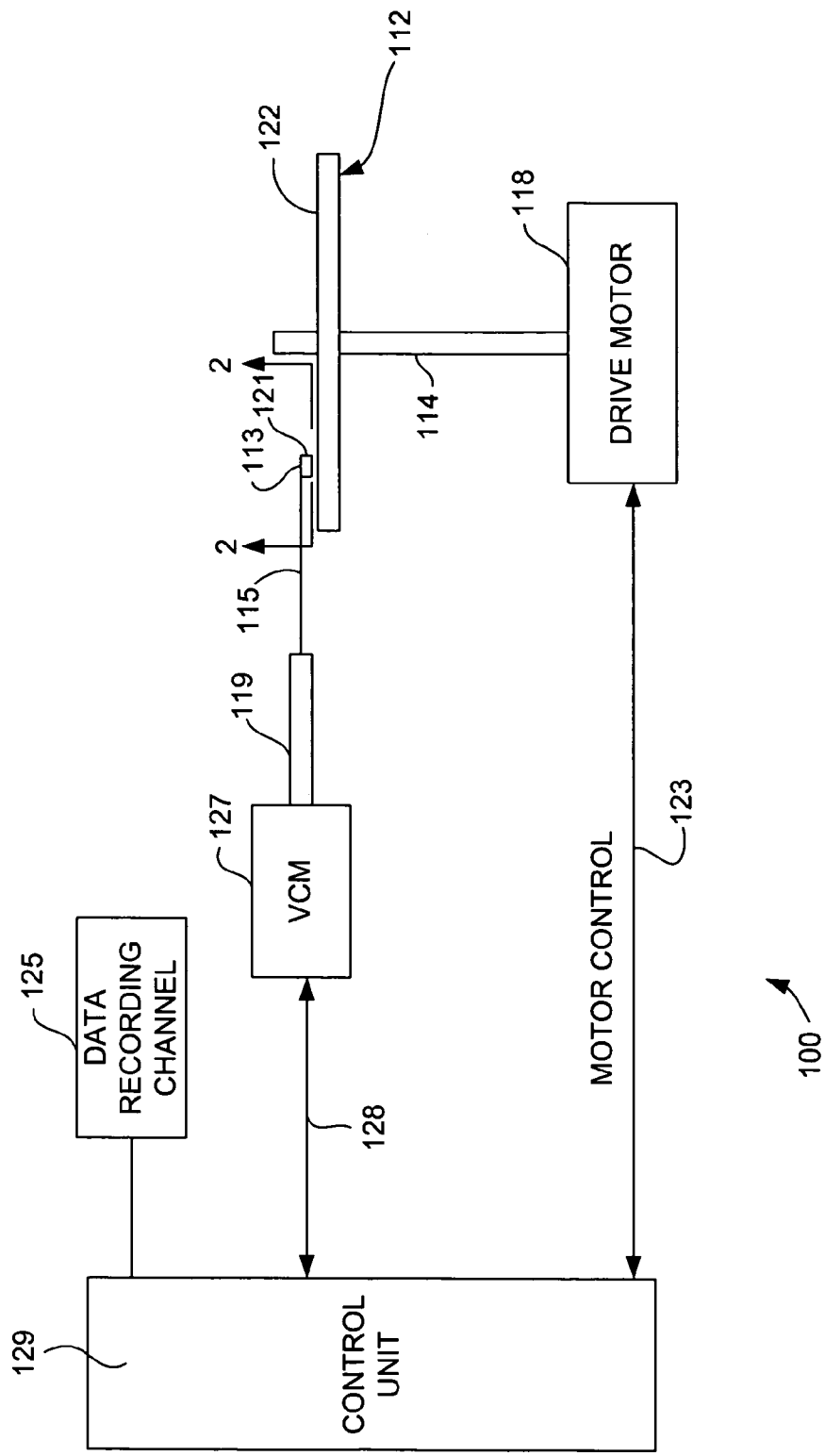
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
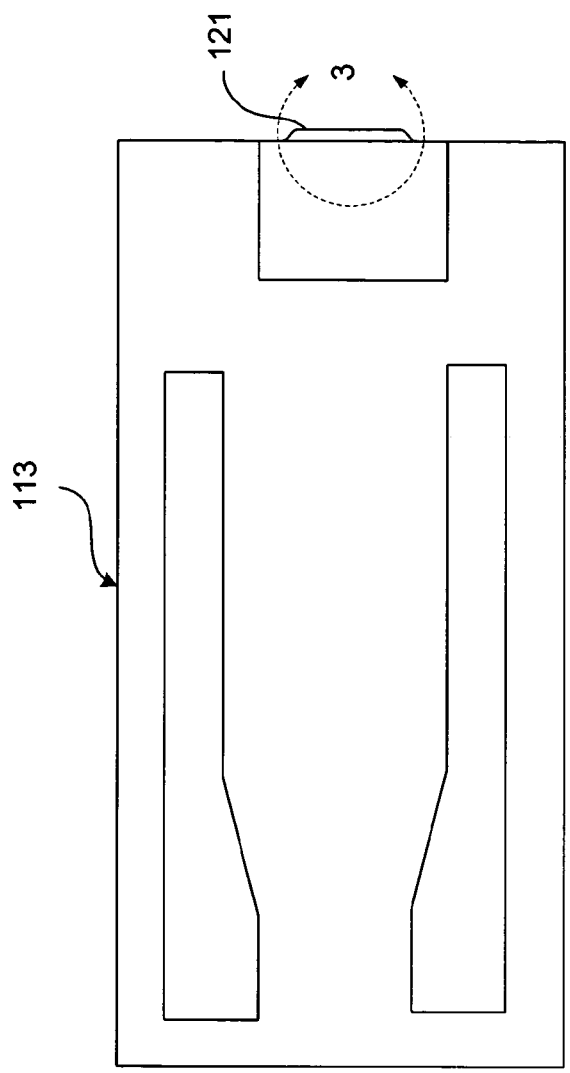
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
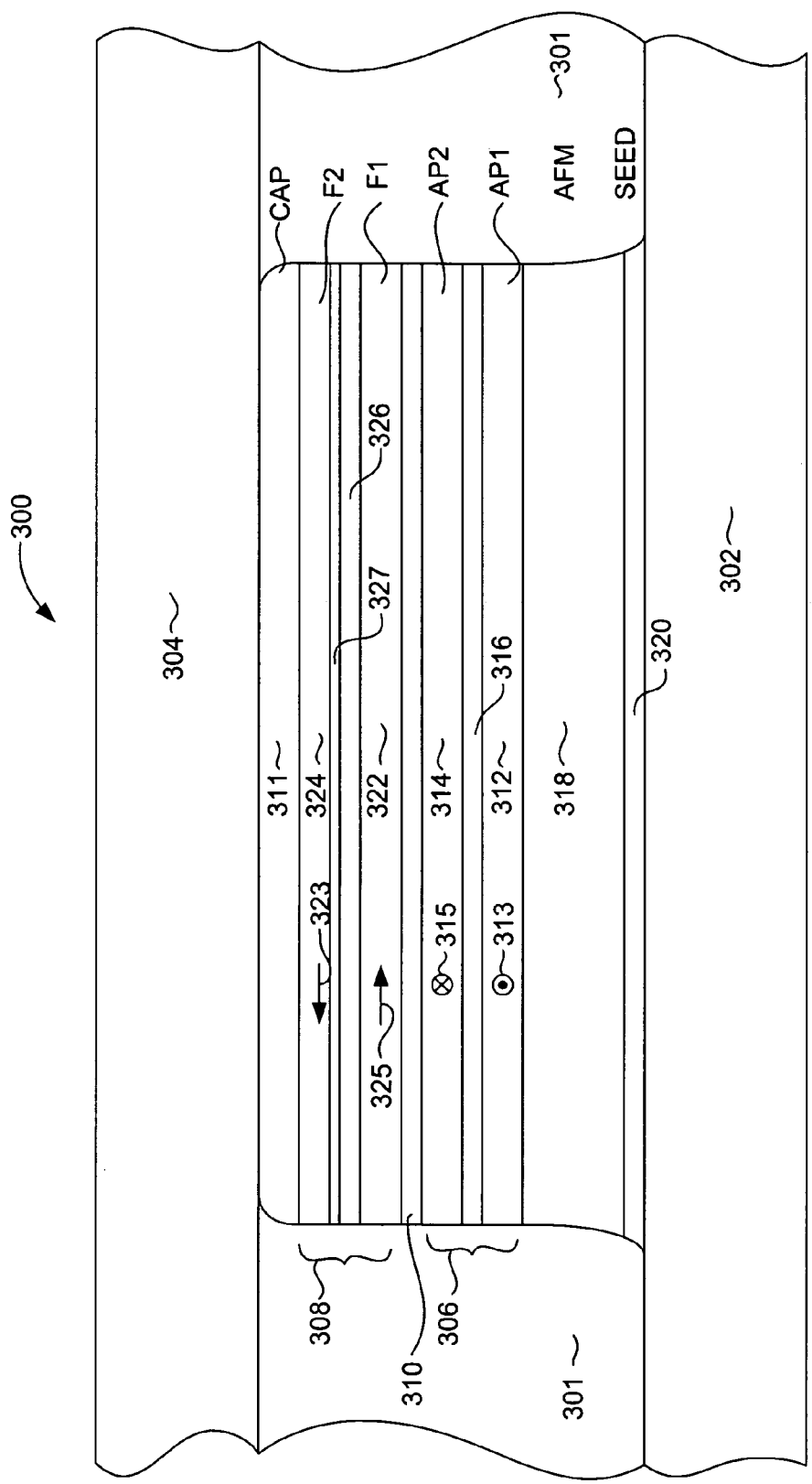
FIG. 3 is an ABS view of a magnetic sensor according to an embodiment of the present invention taken from circle 3 of FIG. 2.

With reference now to FIG. 3, a magnetic head according to one possible embodiment of the invention includes a current perpendicular to plane (CPP) GMR sensor 300 that is sandwiched between first and second shields 302, 304. The shields 302, 304 are constructed of a magnetic, electrically conductive material such as for example NiFe and also function as electrical leads, conducting sense current to the sensor 300 to be electrically conducted through the sensor perpendicular to planes of layers making up the sensor (ie. vertically with respect to FIG. 3). A fill material 301, such as alumina can be provided between the shields 302, 304 outside of the area of the sensor 300. In some designs, hard bias layers to stabilize the free layer are placed outside the fill material 301, in this case, usually very thin fill material 301 is used so that the hard bias layers are placed in close proximity to the free layer to provide strong biasing. The 301 insulation layer between the hard bias layers and the sensor is essential to prevent sense current shunting.

The sensor 300 further includes a magnetically pinned layer 306 and a magnetically free layer 308. A non-magnetic spacer layer 310 is sandwiched between the free layer 308 and pinned layer 306. The present embodiment is described in terms of a CPP GMR and as such the spacer 310 layer may be one of several electrically conductive materials and is preferably Cu. Those skilled in the art will appreciate that the sensor could also be a tunnel valve, in which case the spacer 310 would be a non-magnetic electrically insulating material such as Alumina. The sensor may also include a capping layer 311, which may be for example Ta formed over the free layer 308.

With continued reference to FIG. 3, the pinned layer 306 may include first and second magnetic layers 312, 314 having magnetizations that are pinned antiparallel to one another, as indicated by symbols 313,315, across an AP coupling layer 316 that may be for example Ru. The magnetization of the pinned layer 306 may be pinned by exchange coupling the first magnetic layer 312 with an antiferromagnetic layer 318. The antiferromagnetic material of layer 318, which may be for example PtMn or IrMn, does not in and of itself have a magnetization, but when exchange coupled with a magnetic material such as first magnetic layer 318, strongly pins the magnetization of that magnetic layer. A seed layer 320 could also be provided at the bottom of the sensor to promote a desired crystallographic structure in the layers formed thereon.

It should also be pointed out that the pinned layer 306 could also be self-pinned, in which case the AFM layer 318 would not be needed. In that case the pinned layer would be pinned by a combination of intrinsic anisotropy of the layers 312, 314 and magnetostriction of those layers 312, 314 combined with compressive stresses which inevitably exist in the sensor 300. The invention contemplates the use of either an AFM pinned or self pinned sensor. The first and second magnetic materials 312, 314 can be constructed of a magnetic material containing substantially equal parts of Co and Fe, ie. $Co_{50}Fe_{50}$. The 50—50 percentages are atomic percent and need not be exact. The percentages of either material could vary for example by 10% in either direction. The magnetic layers 312, 314 of the pinned layer could also be made of many other magnetic materials as well, such as Co or NiFe.

With continued reference to FIG. 3 the free layer is a synthetic free layer having first and second magnetic layers 322, 324 separated by a non-magnetic coupling layer 326 such as Ru. Like the pinned layer, the magnetic layers 322, 324 of the free layer have magnetizations 323, 325 that are antiparallel coupled across the spacer layer 326, but are free to rotate in response to a magnetic field. The first magnetic layer 322, that which is closest to the spacer layer 310, is preferably constructed of substantially equal parts of Co and Fe, ie. $Co_{50}Fe_{50}$. This first layer 322 could also preferably be constructed of an alloy containing Co, Fe and Cu, such as for example $Co_{42}Fe_{43}Cu_{15}$, or could be constructed as a mutilayer film including layers of $Co_{50}Fe_{50}$ interspersed with layers of Cu.

These materials described for constructing the first magnetic layer 322 of the free layer 308 have been found to provide increased GMR effect. However, as described above they also have a strong positive magnetostriction which tends to move the magnetization to a direction perpendicular to the ABS surface. The desired direction of magnetization is parallel with the ABS as indicated by arrows 323, 325. This strong positive magnetostriction, when present in the free layer 308 as a whole, would lead to unacceptable signal noise, increased error rate, and free layer instability.

With continued reference to FIG. 3, in order to alleviate the positive magnetosriction of the first layer 322, the second layer 324 of the free layer is constructed of a material having a negative magnetostriction. The relative thicknesses of the layers 322, 324 can be selected create net zero magnetostriction for the free layer 308 as a whole. The second layer 324 of the free layer 308 is constructed of an amorphous CoNiX alloy, where X is one of the following materials: Nb, Mo, W, Si and B. The alloy is preferably 75 atomic percent Co and 25 atomic percent NiX. Constructing the second layer 324 of the above described CoNiX material, causes the second layer to have no contribution to GMR effect. This advantageously prevents the second layer 324 from subtracting from the GMR effect as would otherwise be experienced if layer 324 were constructed of a material that contributed to GMR such as CoFe. In this way, the advantages of the second layer such as greater physical thickness, magnetostriction control, and decreased magnetic thickness, can be enjoyed without the undesirable GMR subtraction experienced in prior art synthetic free layers.

With continued reference to FIG. 3, the presence of the "X" elements (Nb, Mo, W, Si and B) also advantageously causes the second layer 324 of the free layer 308 to be amorphous. Magnetostriction of a material can be effected by two factors, material composition and crystallographic structure, ie. the epitaxial growth of the material. When attempting to construct a material layer to have a specific magnetostriction, trying to control two separate effects simultaneously can be extremely challenging. By eliminating one of those factors (ie. epitaxy) the magnetostriction can be much more easily controlled through adjustment of material composition alone. In addition, a very thin (5–10 Angstroms) layer of $Ni_{90}Fe_{10}$ 327 is preferably provided adjacent to the coupling layer 326 to assist the antiparallel coupling of the first and second free layers 322, 324 across the coupling layer 326.

Figure 4:
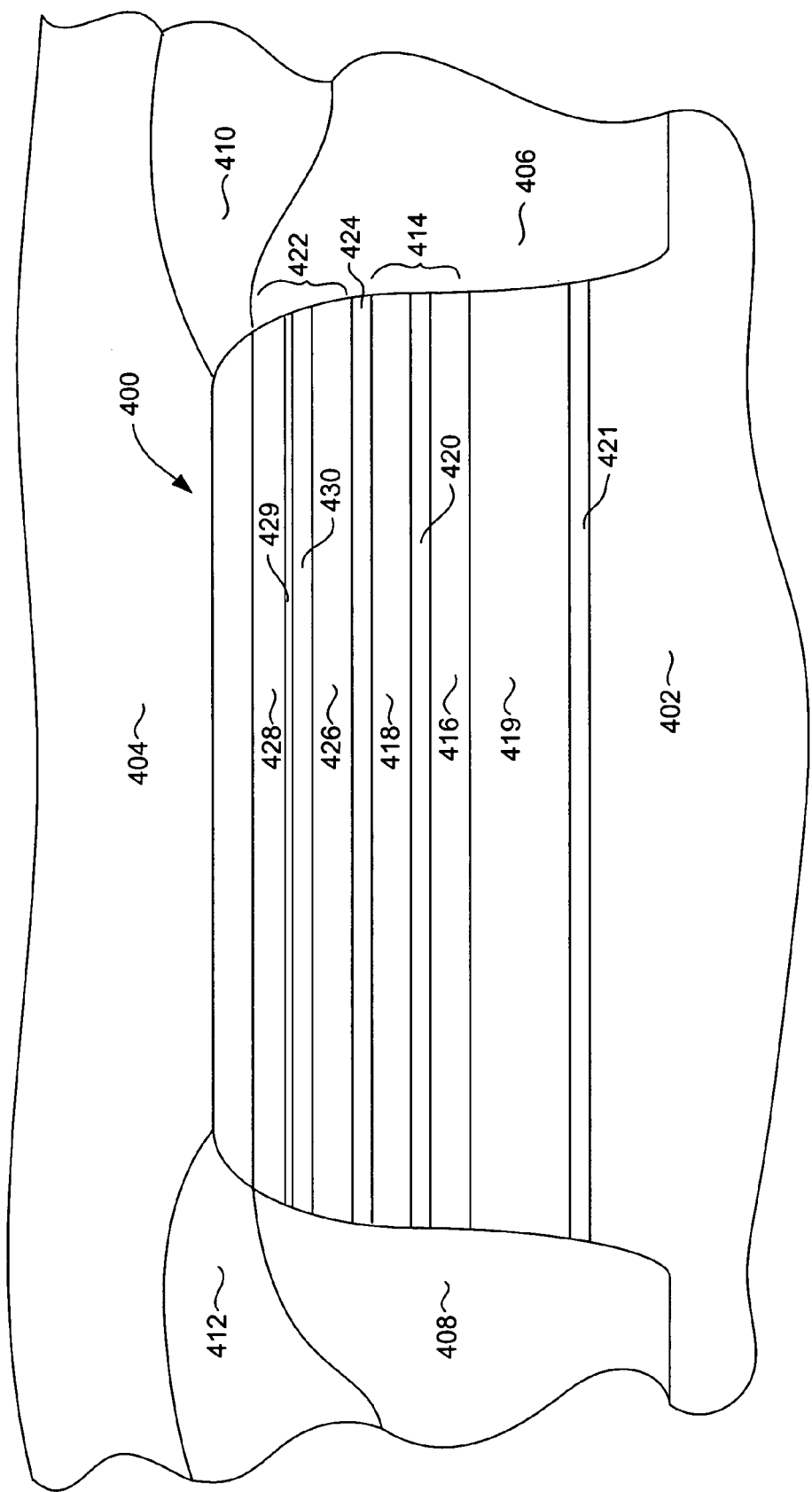
FIG. 4 is an ABS view of a magnetic sensor according to an alternate embodiment of the invention.

With reference now to FIG. 4, the present invention can also be embodied in a current in plane (CIP) sensor 400. The sensor 400 is constructed on a first gap layer 402 that provides a non-magnetic, dielectric substrate on which to construct the sensor 400. A second gap 404 is formed over the top of the sensor 400. First and second hard bias layers 406, 408 formed at either side of the sensor 400 are constructed of a relatively high coercivity magnetic material. First and second electrically conductive leads 410, 412 are formed over the hard bias layers and over a potion of each side of the sensor. The leads 410, 412 provide electrical sense current to the sensor which can be conducted along the plane of the material layers of the sensor 400 from one side to the other.

The sensor includes a pinned layer 414, which can be an antiparallel (AP) pinned layer having first and second magnetic layers 416, 418 that have their magnetizations antiparallel pinned across a coupling layer 420 that can be for example Ru. The first magnetic layer 416 of the pinned layer can be constructed of $Co_{50}Fe_{50}$ or some similar material. The second pinned layer 418 can be formed of $Co_{90}Fe_{10}$ or some similar material. The pinned layer 414 can be pinned by exchange coupling with an AFM layer 419, or can be self pinned as described with reference to the embodiment illustrated with reference to FIG. 3. In addition a seed layer 421 can be provided to assure a desired epitaxial growth of the various layers of the sensor 400.

The pinned layer 406 is separated from a magnetic free layer 422 by a non-magnetic, electrically conductive spacer layer 424, which can be for example Cu. The free layer includes first and second magnetic layers 426, 428 separated by a coupling layer 430, which can be for example Ru. The first and second magnetic layers have magnetizations that are antiparallel coupled across the spacer layer 430 but are free to rotate in the presence of a magnetic field. The first magnetic layer 426 of the free layer can be constructed of $Co_{90}Fe_{10}$ or some similar material. The second magnetic layer 428 of the free layer 422 can be constructed of CoNiX, where X is one of the following materials: Nb, Mo, Si, B. As with the embodiment described with reference to FIG. 3, the material of the second magnetic layer 428 has a negative magnetostriction that compensates for the positive magnetostriction of the first magnetic layer 426, thereby maintaining the free layer stability that would otherwise be lost if the free layer 422 had a net positive magnetostriction. Also, as described with reference to the embodiment illustrated in FIG. 3, the second layer 428 of the free layer 422 provides no GMR effect and so does not subtract from the GMR effect provided by the first layer 426. The second free layer 428 preferably includes a thin (5 to 10 Angstrom) layer of $Ni_{90}Fe_{10}$ 429 to assist in the antiparallel coupling of the first and second magnetic layers 426, 428 of the free layer 422.

While the above embodiments have been described with reference to CIP and CPP GMRs it should be pointed out that the inventive concepts of the present invention can be embodied in many other types of sensors. For example, the sensor could be a differential GMR sensor. In addition, the sensor could be a dual GMR sensor having two separate free layers formed on either side of a central pinned layer. Many other embodiments will no doubt become apparent to those skilled in the art that would still fall within the scope of the invention. Therefore, while various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A magnetoresistive sensor, comprising:
   a magnetically pinned layer;
   a magnetically free layer;
   a non-magnetic spacer layer sandwiched between the magnetic free layer and the magnetic pinned layer; and
   the magnetic free layer further comprising;
   a first magnetic layer;
   a second magnetic layer comprising a material containing Co, Ni and a material selected from the group consisting of Nb, Mo, W, Si and B;
   a non-magnetic coupling layer sandwiched between said first and second free layers; and
   said first and second magnetic layers of said free layer being aniparallel coupled across said non-magnetic coupling layer.

2. A magnetoresistive sensor as in claim 1 wherein said pinned layer comprises an alloy containing Co and Fe.

3. A magnetoresitive sensor as in claim 1 wherein said pinned layer comprises an allow containing substantially equal parts of Ni and Co.

4. A magnetetoresistive sensor as in claim 1 wherein said pinned layer comprises:
   a third magnetic layer;
   a fourth magnetic layer;
   a non-magnetic coupling layer sandwiched between said third and fourth magnetic layers of said pinned layer; and
   wherein at least one of said pinned layers comprises $Co_{50}Fe_{50}$.

5. A magnetoresistive sensor as in claim 1, wherein said non-magentic layer sandwitched between said first and second magnetic layers of said free layer comprises Ru.

6. A magnetoresistive sensor as in claim 1, where said first magnetic layer of said free layer comprises substantially equal parts of Co and Fe.

7. A magnetoresitive sensor as in claim 1, wherein said first magnetic layer of said free layer comprises Co, Fe, and Cu.

8. A magnetoresistive sensor as in claim 1 wherein said first magnetic layer of said free layer comprises $Co_{42}Fe_{43}Cu_{15}$.

9. A magnetoresistive sensor as in claim 1 wherein said first magnetic layer of said free layer comprises $Co_{90}Fe_{10}$.

10. A magnetoresistive sensor as in claim 1 wherein said first magnetic layer of said free layer comprises a thin layer of $Ni_{90}Fe_{10}$ disposed adjacent said non magnetic spacer layer.

11. A magnetoresistive sensor as in claim 1 wherein said first magnetic layer of said free layer comprises a layer of $Ni_{90}Fe_{10}$ disposed adjacent said non-magnetic spacer layer and wherein said layer of $Ni_{90}Fe_{10}$ is 5–10 Angstroms thick.

12. A magnetoresistive sensor as in claim 1, wherein said second magnetic layer of said free layer is 75 atomic percent Co.

13. A magnetoresistive sensor as in claim 1 wherein said sensor is a dual GMR sensor.

14. A magnetoresistive sensor as in claim 1 wherein said sensor is a differential GMR sensor.

15. A current in plane (CIP) magnetoresistive sensor, comprising:
   a pinned layer comprising first and second magnetic layers antiparallel coupled across a first non magnetic coupling layer, said first magnetic layer comprising $Co_{50}Fe_{50}$ and said second magnetic layer comprising $Co_{90}Fe_{10}$;
   a free magnetic layer comprising third and fourth magnetic layer antiparallel coupled across a second non-magnetic spacer layer said third magnetic layer comprising $Co_{90}Fe_{10}$ and said fourth magnetic layer comprising and alloy comprising Co, Ni and a material selected from the group consisting of Nb, Mo, W, Si and B; and
   a non magnetic, electrically conductive spacer layer sandwiched between said free and pinned layers, said first third magnetic layer of said free layer being formed adjacent said non-magnetic, electrically conductive spacer layer.

16. A current perpendicular to plane magnetoresistive sensor, comprising,
   a pinned layer comprising first and second magnetic layers antiparallel coupled across a first non magnetic coupling layer, said first and second magnetic layer comprising $Co_{50}Fe_{50}$;
   a free magnetic layer comprising third and fourth magnetic layer antiparallel coupled across a second non-magnetic spacer layer said third magnetic layer comprising $Co_{50}Fe_{50}$ and said fourth magnetic layer comprising and alloy comprising Co, Ni and a material selected from the group consisting of Nb, Mo, W, Si and B; and
   a non magnetic, spacer layer sandwiched between said free and pinned layers, said first third magnetic layer of said free layer being formed adjacent said non-magnetic, electrically conductive spacer layer.

17. A magnetoresistive sensor as in claim 16 wherein said non-magnetic spacer layer is electrically conductive and said sensor is a current perpendicular to plane giant magnetoresistive sensor (GM)R.

18. A magnetoresistive sensor as in claim 16 wherein said non-magnetic spacer layer is electrically insulating and said sensor is a tunnel valve.

19. A current perpendicular to plane magnetoresistive sensor, comprising,
   a pinned layer comprising first and second magnetic layers antiparallel coupled across a first non magnetic coupling layer, said first and second magnetic layer comprising $Co_{50}Fe_{50}$;
   a free magnetic layer comprising third and fourth magnetic layer antiparallel coupled across a second non-magnetic spacer layer said third magnetic layer comprising $Co_{42}Fe_{43}Cu_{15}$ and said fourth magnetic layer comprising and alloy comprising Co, Ni and a material selected from the group consisting of Nb, Mo, W, Si and B; and
   a non magnetic, spacer layer sandwiched between said free and pinned layers, said first third magnetic layer of said free layer being formed adjacent said non-magnetic, electrically conductive spacer layer.

20. A data storage system, comprising:
   a magnetic medium;
   an actuator;
   a slider connected with the actuator for movement across a surface of said magnetic medium, said slider having a magnetic head comprising:
      an inductive write head; and
      a magnetoresistive sensor comprising:
         a magnetically pinned layer;
         a magnetically free layer;
         a non-magnetic spacer layer sandwiched between the magnetic free layer and the magnetic pinned layer; and
         the magnetic free layer further comprising;
            a first magnetic layer;
            a second magnetic layer comprising a material containing Co, Ni and a material selected from the group consisting of Nb, Mo, W, Si and B;
            a non-magnetic coupling layer sandwiched between said first and second free layers; and
            said first and second magnetic layers of said free layer being aniparallel coupled across said non-magnetic coupling layer.

* * * * *